(12) United States Patent
Kazama

(10) Patent No.: US 6,900,651 B1
(45) Date of Patent: May 31, 2005

(54) ELECTROCONDUCTIVE CONTACT UNIT ASSEMBLY

(75) Inventor: Toshio Kazama, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 09/743,536

(22) PCT Filed: Jul. 9, 1999

(86) PCT No.: PCT/JP99/03714

§ 371 (c)(1),
(2), (4) Date: Mar. 14, 2001

(87) PCT Pub. No.: WO00/03251

PCT Pub. Date: Jan. 20, 2000

(30) Foreign Application Priority Data

Jul. 10, 1998 (JP) .......................................... 10-195808

(51) Int. Cl.[7] ................................................ G01R 1/67
(52) U.S. Cl. ...................................... 324/761; 324/754
(58) Field of Search ............................. 324/158.1, 754, 324/755, 761, 762; 439/482, 824

(56) References Cited

U.S. PATENT DOCUMENTS 4,773,877 A * 9/1988 Kruger et al. ............... 439/482
5,414,369 A * 5/1995 Kazama ....................... 324/758
6,043,666 A   3/2000 Kazama ....................... 324/754

FOREIGN PATENT DOCUMENTS

| JP | 63-7357 | 1/1988 |
| JP | 63-293845 | 11/1988 |
| JP | 07161416 | 6/1995 |
| JP | 9-121007 | 5/1997 |
| JP | 10-19926 | 1/1998 |
| WO | WO97/39361 | 10/1997 |

* cited by examiner

Primary Examiner—Vinh P. Nguyen
(74) Attorney, Agent, or Firm—MacPherson Kwok Chen & Heid LLP

(57) ABSTRACT

A low electric resistance is accomplished because there are no parts connecting different components as opposed to the arrangement using an electroconductive needle member and an electroconductive coil spring, and a low electric inductance can be accomplished because the coil spring is closely wound and surface processed with highly electroconductive material, thereby providing a straight electric path along the axial direction of the closely wound portion of the coil spring. Because the coil spring portion has a uniform pitch, and the contact unit consists of closely wound portions and the uniform pitch portion, it can be formed with a simple coiling process, and the manufacturing cost can be minimized.

18 Claims, 7 Drawing Sheets

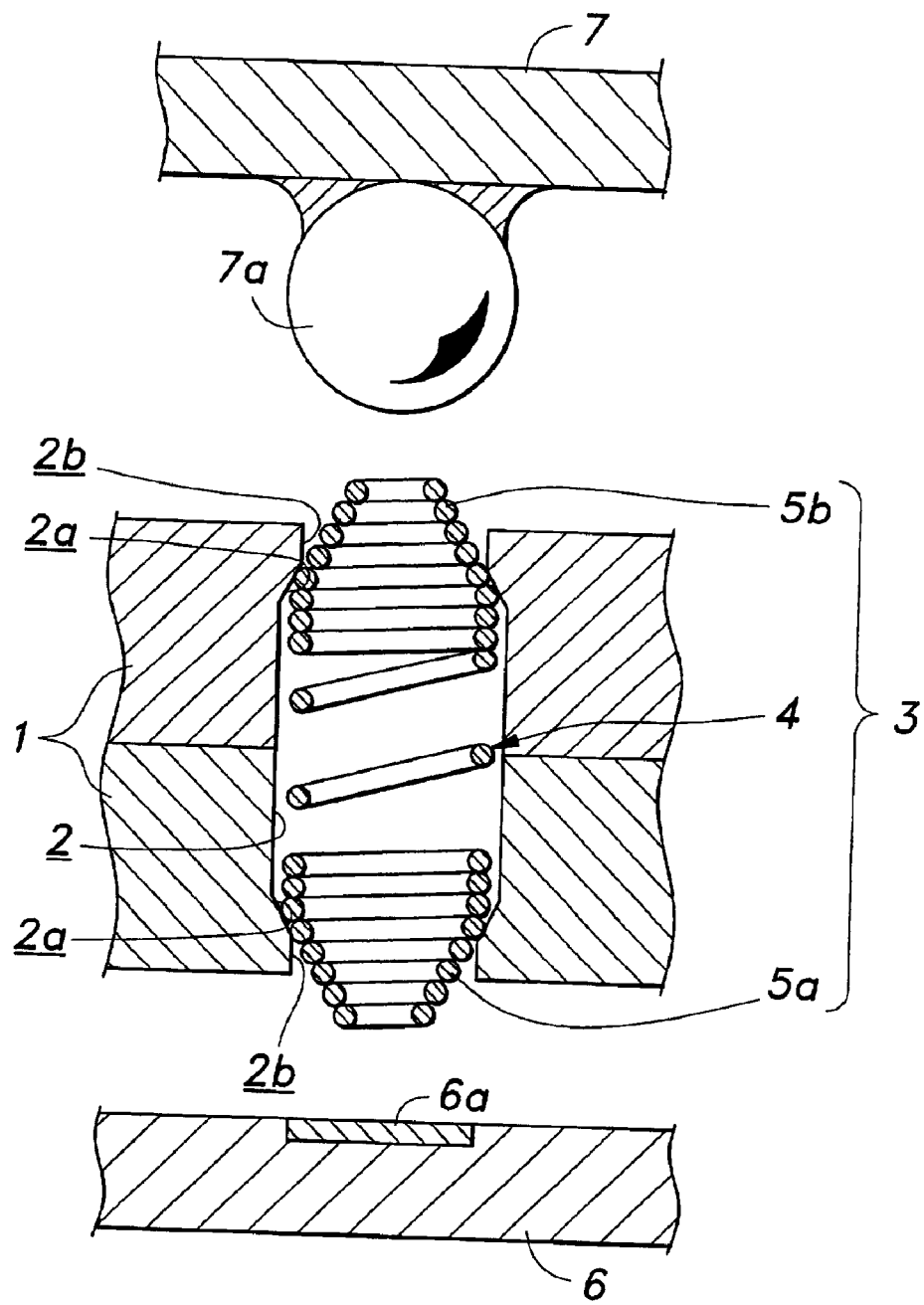

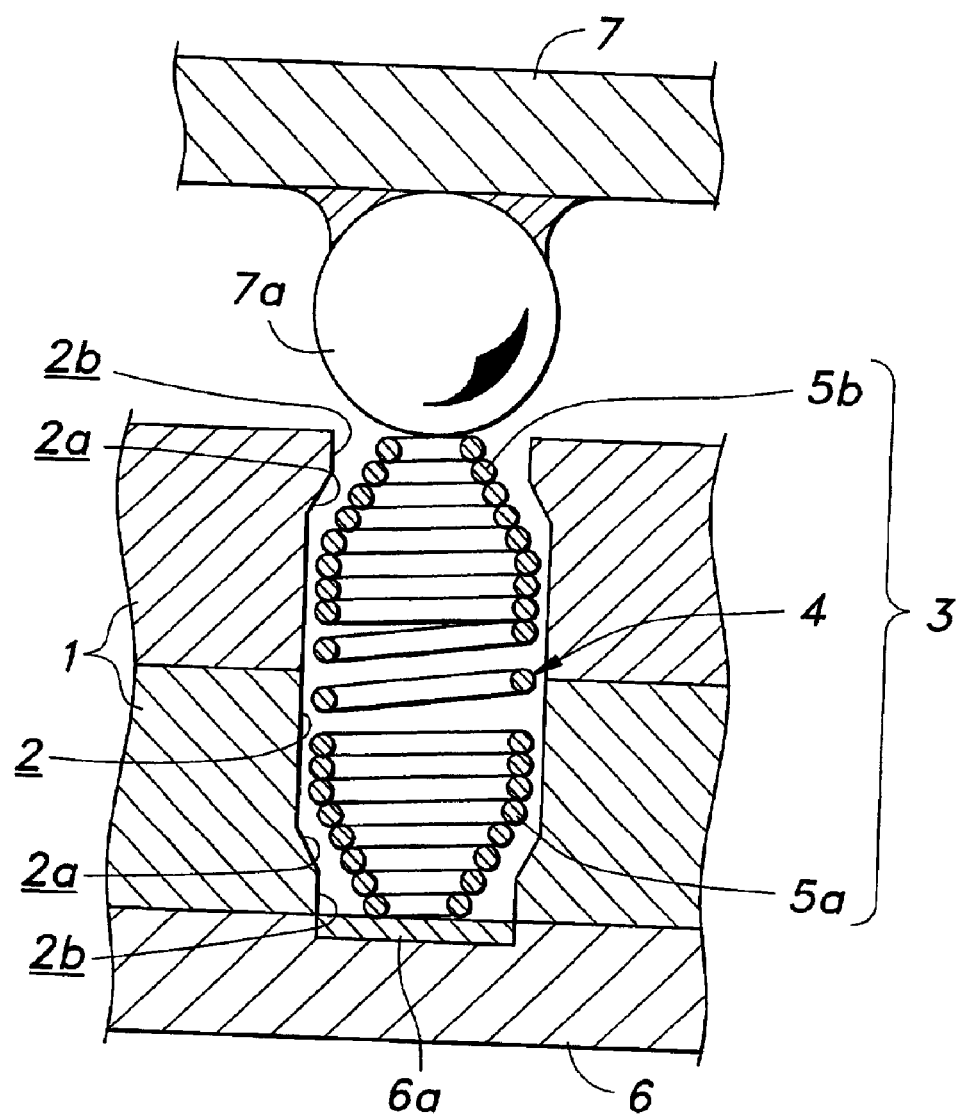

ELECTROCONDUCTIVE CONTACT UNIT ASSEMBLY

TECHNICAL FIELD

The present invention relates to an electroconductive contact unit assembly which is suitable for use in contact probes and probe cards for testing semiconductor devices and wafers, sockets in such forms as LGA (land grid array), BGA (ball grid array), CDP (chip side package) and bare chip, and connectors.

BACKGROUND OF THE INVENTION

Conventionally, various forms of electroconductive contact units have been used in contact probes for conducting electric tests on electroconductive patterns of printed circuit boards and electronic component parts (open/short tests, environment tests and burn-in tests), sockets (including packages) for semiconductor devices (LGA, BGA, CSP and bare chip), and connectors.

When using such a socket for semiconductor devices, it is necessary to consider the fact that signal frequencies for semiconductor devices have significantly increased in recent years, and may be as high as hundreds of MHz. A socket for semiconductor devices that operate at such a high frequency level is required to use electroconductive contact units of low inductance and resistance and to be of a highly compact design in terms of mounting space.

BRIEF SUMMARY OF THE INVENTION

To accomplish such a task, and provide an electroconductive contact unit assembly having low electric inductance and resistance to meet the need in high frequency operation, and featuring a highly compact design, the present invention provides an electroconductive contact unit assembly comprising a electroconductive contact unit in the form of a coil spring for resiliently contacting an object to be contacted, the contact unit being coaxially received in a through hole formed in an insulating support member, characterized by that: the through hole is shaped so as to have a reduced diameter portion at least at one axial end thereof; the contact unit in the form of a coil spring comprising a coil spring portion received in an intermediate part of the through hole and a pair of electrode pin portions, which are each closely wound at corresponding ends of the coil spring portion, and at least one of which is tapered or stepped in shape so as to be prevented from coming off by the reduced diameter portion; the contact unit being surface processed by highly electroconductive material.

Thus, a low electric resistance is accomplished because there are no parts connecting different components as opposed to the arrangement using an electroconductive needle member and an electroconductive coil spring, and a low electric inductance can be accomplished because the coil spring is closely wound and surface processed with highly electroconductive material, thereby providing a straight electric path along the axial direction of the closely wound portion of the coil spring. Because the electrode pin portions are retained and positioned by the cooperation between the tapered sections of the through hole and the tapered electrode pin portions, the axial length can be minimized and the contact unit is made more suited for compact design as opposed to the arrangement which slidably supports a needle member with a straight hole.

Preferably, the reduced diameter portion comprises a tapered hole section provided at each axial end of the through hole, and the pair of electrode pin portions are tapered in shape and closely wound so as to be prevented from coming off by the tapered hole sections of the through hole. Thus, the retention and positioning of the both electrode pin portions of the electroconductive contact unit having two moveable ends can be accomplished, and the aforementioned advantages can be obtained.

According to a preferred embodiment of the present invention, the reduced diameter portion has a smaller inner diameter than the outer diameter of the coil spring portion, and is provided at each axial end of the through hole, and the other of the pair of electrode pin portions has a cylindrical shape which has a smaller diameter than the reduced diameter portion. Thus, when the object to be contacted has a convex surface as is the case with a solder ball, the electrode pin portion having a cylindrical shape can be applied to the object to be contacted with a certain guiding action, and a stable contact with an object such as a solder ball can be achieved.

If the coil spring portion is wound at a uniform pitch, because the contact unit consists of closely wound portions and a uniform pitch portion, it can be formed with a simple coiling process.

If the electrode pin portions are each closely wound with a pre-stress, the contact between the adjacent turns of the coil wire can be improved.

If the surface processing is conducted after the coil spring portion and electrode pin portions are formed out of a wire member, the manufacturing process can be simplified, and the contact resistance of the closely wound portions can be minimized.

If the surface processing is conducted both before and after the coil spring portion and electrode pin portions are formed out of a wire member, the contact resistance of the closely wound portions can be minimized.

BRIEF DESCRIPTION OF THE DRAWINGS

FIG. 1 is an enlarged sectional side view of an essential part of a socket for semiconductor devices embodying the present invention;

FIG. 3 is a view similar to FIG. 1 showing the socket for semiconductor devices embodying the present invention during use;

DETAILED DESCRIPTION OF THE PREFERRED EMBODIMENTS

Figure 2A:
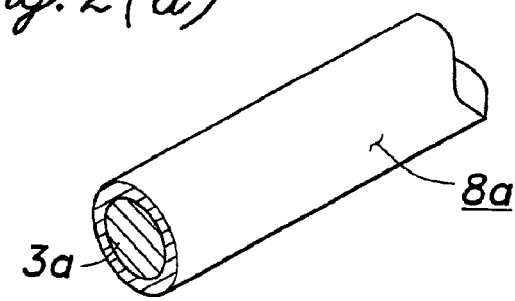
FIG. 2(a) is a fragmentary perspective view of an essential part showing the coil wire which is gold plated.

Now the present invention is described in the following in more detail in terms of concrete embodiments with reference to the appended drawings.

FIG. 1 is an enlarged sectional side view of an essential part of a socket for semiconductor devices embodying the present invention. The illustrated socket comprises an insulating support member, for instance, consisting of a pair of insulating plates 1 which are made of plastic material and laminated one over the other. The support member integrally combining the two insulating plates 1 is provided with a through hole 2 extending across the thickness of the insulating plates 1, and an electroconductive contact unit 3 in the form of a coil spring is coaxially received in the through hole 2.

The through hole 2 comprises a linear and straight hole section having a uniform diameter and extending over a certain axial length in an axially intermediate part, and tapered hole sections 2a connected to either axial end of the intermediate part of the through hole 2 and each having an open outer end. Each tapered hole section 2a opens to the outside via a straight small hole section 2b having a uniform diameter and a prescribed length.

The electroconductive contact unit 3 in the form of a coil spring is formed by winding a coil wire made of spring material into a coil, and comprises a coil spring portion 4 received in the linear and straight section of the through hole 2 with a certain radial play, and wound at a prescribed pitch, and a pair of electrode pin portions 5a and 5b each consisting of a closely wound portion including a plurality of turns provided adjacent to the corresponding axial end of the coil spring portion 4 and having a same diameter as the coil spring portion 4 and tapered portion extending to the coil end. The tapered portion of each of the electrode pin portions 5a or 5b has a complementary shape with respect to the tapered hole sections 2a of the through hole 2, and the pointed end includes a portion having a smaller diameter than the straight small hole section 2b so that the pointed end may project out of the straight small hole section 2b.

The electroconductive contact unit 3 in the form of a coil spring is received in the through hole 2 with the coil spring portion 4 placed under compression. For instance, the two insulating plates 1 are placed one over the other with the electrode pin portions 5a and 5b received in the corresponding parts of the through hole 2 formed in the insulating plates 1 so that the electroconductive contact unit 3 in the form of a coil spring may be assembled in the insulating plates 1 with the coil spring portion 4 placed under a pre-stress. It is also possible to place the electroconductive contact unit 3 in the through hole 2 without compressing the coil spring portion 4. This simplifies the assembly work.

Because the electrode pin portions 5a and 5b are tapered, simply by slightly fitting their free ends in the openings of the corresponding portions of the through hole 2 of the insulating plates 1, the electrode pin portions 5a and 5b are snugly received in the tapered hole sections 2a as the two insulating plates 1 are placed one over the other owing to the guiding action of the tapered hole sections 2a for the electrode pin portions 5a and 5b. Therefore, as opposed to the prior art which required each needle shaped electrode pin to be fitted into a corresponding hole, the assembly work is substantially simplified.

When the two insulating plates 1 are assembled to be in close contact to each other by using threaded bolts or the like, the resilient force of the coil spring portion 4 pushes the tapered portions of the electrode pin portions 5a and 5b against the tapered surfaces of the corresponding tapered hole sections 2a which are complementary to the tapered portions of the electrode pin portions 5a and 5b. Owing to the engagement between the opposing tapered surfaces, the lateral shifting of the free ends of the electrode pin portions 5a and 5b can be favorably minimized. Therefore, when a plurality of such electroconductive contact units are arranged in a matrix as is the case with a socket, the projecting end of each electrode pin portion 5a or 5b can be arranged in a planar coordinate system at a high precision without any effort during the assembly work.

Thus, each electrode pin portion 5a or 5b of the electroconductive contact unit 3 in the form of a coil spring received in the through hole 2 can project out of the through hole 2 by a prescribed length under a rest condition. When the socket is in use, the electrode pin portions 5a and 5b are brought into contact with the circuit pattern 6a of the printed circuit board 6 and a terminal 7a of a semiconductor device which, for instance, may consist of a solder hall of a BGA 7.

By applying a pre-stress to the electroconductive contact unit 3 in the form of a coil spring, the fluctuation in the load owing to the fluctuation in the deflection of each electroconductive contact unit or the fluctuation in the height of the object to be tested (circuit pattern 6a or terminal 7a) can be favorably minimized.

Figure 2B:
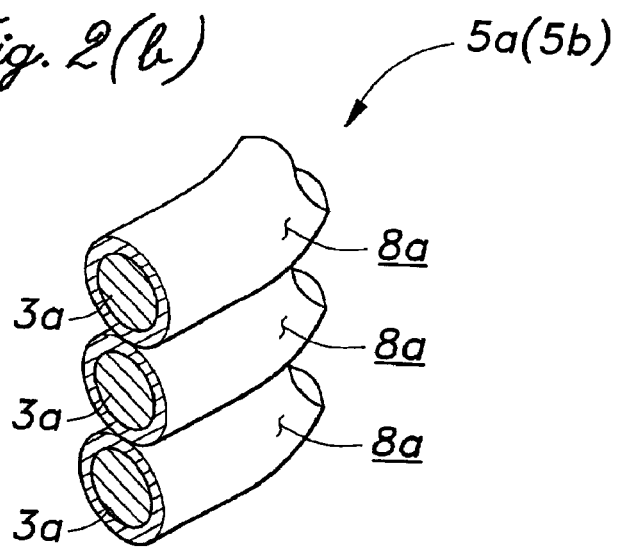
FIG. 2(b) is a view similar to FIG. 2(a) showing the coil wire after it is closely wound.
Figure 2C:
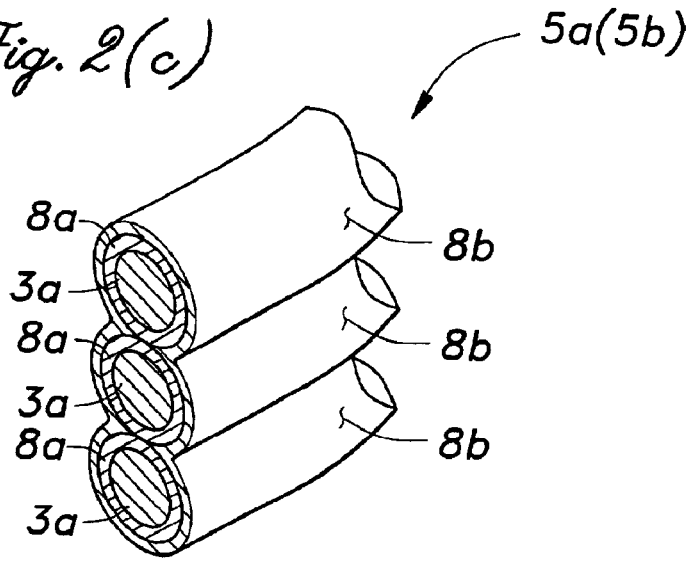
FIG. 2(c) is a view similar to FIG. 2(b) showing the coil wire after it is gold plated once again.

FIG. 2 shows the mode of making the electroconductive contact unit 1 in the form of a coil spring according to the present invention. First of all, as shown in FIG. 2(*a*), a coil wire 3a made of spring material as mentioned earlier is plated with gold which is a highly electroconductive material, and a gold plate layer 8a is formed over the entire outer surface of the coil wire 3a. The plating material is not limited to gold, but may also consist of Ni or Cu.

Then, the gold-plated coil wire 3a is subjected to a coiling process, and formed so as to have the coil spring portion 4 and the electrode pin portions 5a and 5b as illustrated in FIG. 1. The electrode pin portions 5a and 5b are each closely wound as illustrated in FIG. 2(*b*), and the adjacent turns of the coil wire 3a in the closely wound portion is made to abut each other by applying a pre-stress to the coil wire 3a. As a result, in each of the electrode pin portions 5a and 5b which consist of closely wound portions, the adjacent turns of the coil wire 3a are in contact with each other via the gold plate layer 8a with a certain biasing force acting between them.

Referring to FIG. 2(*c*), an additional gold plating process is applied to the assembly in the state illustrated in FIG. 2(*b*), and a second gold plate layer 8b is formed over the entire outer circumferential surface of each closely wound portion. In this case also, the plating material is not limited to gold, but may also consist of Ni or Cu. As a result, the adjacent turns of the coil wire 3a is joined together not only by the mechanical biasing force but also by the second gold plate layer 8b which is formed continuously in the axial direction of the coil. This not only ensures a close contact between the adjacent turns of the coil wire 3a but also reduces the electric resistance which otherwise relies strictly on the close contact between the adjacent turns of the coil wire 3a.

FIG. 3 shows a socket using a number of electroconductive contact units 3 in the form of a coil spring having the above described structure. In this case, because the electric signal is conducted solely through the electroconductive contact unit 3 in the form of a coil spring, and there is no connecting part such as a solder connection between the circuit board 6 and the BGA 7, the electric resistance can be stabilized. The coil spring portion 4 is necessary for bringing the contact unit into a resilient contact with the object to be accessed, and the electric inductance H is related to the number of turns N of the coil wire 3a by the relationship $H=AN^2/L$ where A is a coefficient and L is the length of the spring. Therefore, it can be seen that N should be as small as possible to minimize the electric inductance, and the spring portion preferably consists of about two turns, but may consist of up to 10 turns.

Because the adjacent turns of the coil wire in the electrode pin portions 5a and 5b are in close contact with each other under a pre-stress, and the assembly is entirely covered by the second gold plate layer 8b which continuously extends in the axial direction of the coil, the path of electric conduction in each of the electrode pin portions 5a and 5b extends linearly along the axial direction of the coil. Therefore, even though the coil wire is wound into a coil, the electric current does not flow along a spiral path, and this contributes to the reduction in the electric resistance and inductance.

Because the straight small hole section 2b connects the terminal end of the tapered hole section 2a of the through hole 2 to the outside, the free ends of the tapered electrode pin portions 5a and 5b would not be inadvertently caught by the terminal end of the tapered hole section 2a of the through hole 2. Owing to the shape of the straight small hole section 2b, a certain thickness is ensured to the opening, and this prevents inadvertent damage to the opening by contact with the terminal which consists of a solder ball.

Figure 4:
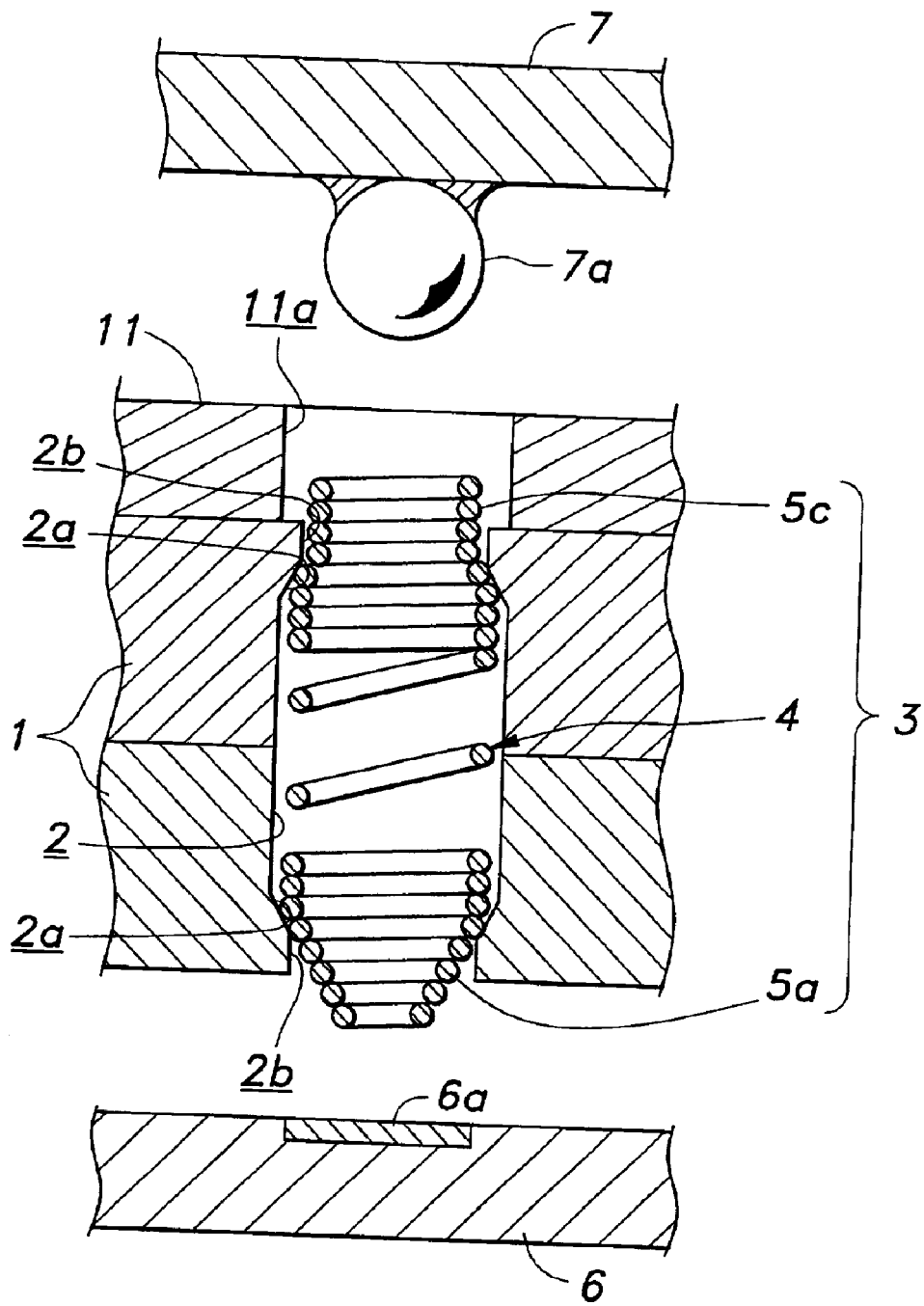
FIG. 4 is a view similar to FIG. 1 showing a second embodiment of the present invention.

FIG. 4 shows a second embodiment of the present invention. The parts corresponding to those of the previous embodiment are denoted with like numerals, and are not described again. In this embodiment, a stopper 11 similarly made of insulating material is laminated over the upper surface of the upper insulating plate 1 as seen in the drawing, and a hole 11a is passed through the stopper 11 in registration with the through hole 2.

The lower electrode pin portion 5a in the drawing is tapered in a similar manner as in the previous embodiment, but the upper electrode pin portion 5c consists of a cylindrical portion having a smaller diameter than the coil spring portion 4, and is received in the hole 11a.

Figure 5:
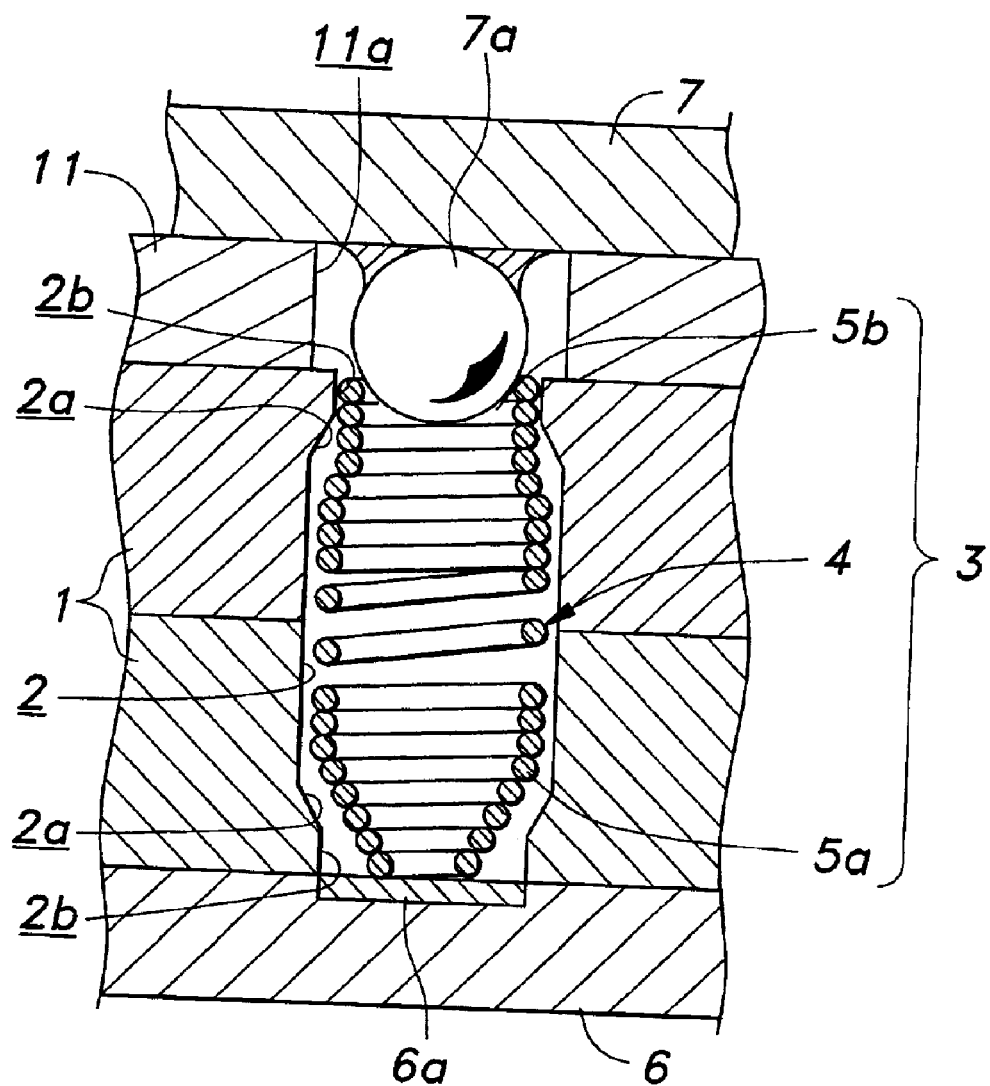
FIG. 5 is a view similar to FIG. 3 showing the second embodiment of the present invention.

The mode of use of this electroconductive contact unit 13 in the form of a coil spring in a socket is illustrated in FIG. 5 which is similar to FIG. 3. As mentioned earlier, because the stopper 11 is laminated over the upper surface of the insulating plate 1, the lower surface of the BGA 7 engages the upper surface of the stopper 11, thereby determining the position of the BGA 7. Therefore, the distance of intrusion of the terminal 7a into the hole 11a is favorably controlled, and the electrode pin portion 5c can engage the terminal 7a with a constant load at all times. Therefore, the contact pressure of the electroconductive contact unit can be stabilized as compared with the case where the stopper 11 is not used, and a stable state of contact may be maintained when testing a large number of identical products.

In the second embodiment also, because the electric current does not flow along a spiral path in the electrode pin portions 5a and 5c, the electric resistance and inductance can be reduced.

Figure 6:
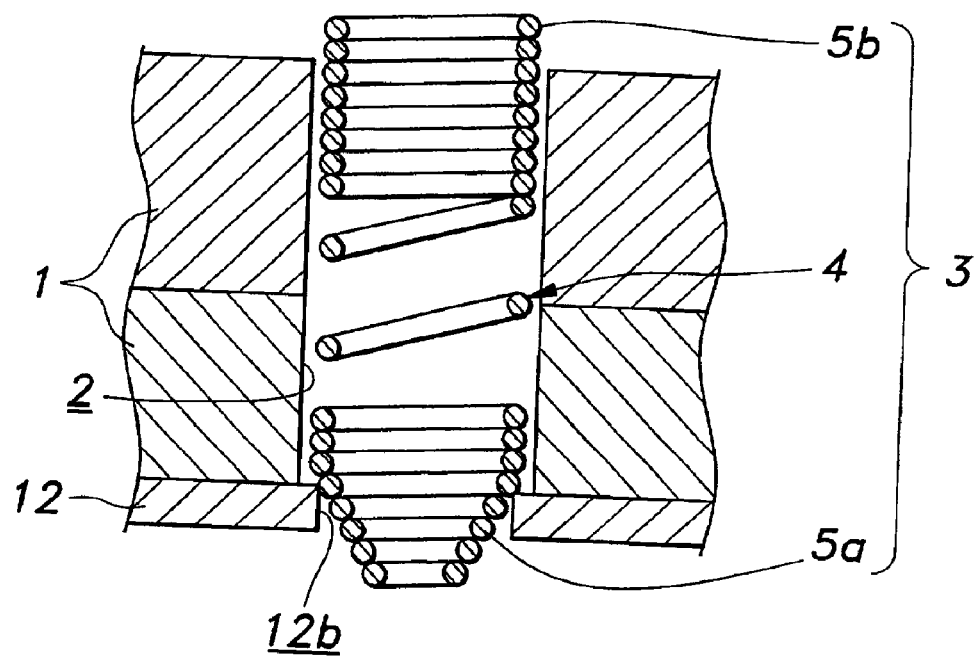
FIG. 6 is a view showing a third embodiment of the present invention.

FIG. 6 shows a third embodiment of the present invention. The parts corresponding to those of the previous embodiments are denoted with like numerals, and are not described again.

In the third embodiment, there is no tapered hole section 2a which is connected to the intermediate part of the through hole 2. Instead, a retaining plate 12 is laminated over the lower surface of the lower insulating plate 1 to prevent the lower tapered electrode pin portion 5a from coming off. The retaining plate 12 is formed with a small hole 12b which has a smaller diameter than the coil spring portion 4, and the electroconductive contact unit 3 in the form of a coil spring received in the through hole 2 is prevented from coming off by the axially intermediate part of the tapered electrode pin portion 5a abutting the edge of the small hole 12b.

The electrode pin portion 5b on the upper end of the coil spring portion 4 consists of a closely wound straight portion having a same diameter as the coil spring portion 4. Thus, even when the electroconductive contact unit 3 in the form of a coil spring is not retained in one direction, it can be used in a similar manner as in the other embodiments without any inconvenience by placing the assembly so that the tapered electrode pin portion 5a faces downward as shown in the drawing. In this case also, the electric current does not flow along a spiral path in the electrode pin portions 5a and 5d as was the case with the previous embodiments, and the electric resistance and inductance can be reduced.

Because the tapered hole section 2a is not required to be formed, the forming and assembling processes are simplified. For instance, during a time period in which products of a same model are required to be tested, a same relay board may be kept integrally attached to the upper surface of the upper insulating plate 1 with the upper electrode pin portion 5b kept constantly in contact with a terminal on the relay board. Because only the lower electrode pin portion 5a is required to access each of the products to be tested, the electroconductive contact unit 3 in the form of a coil spring is allowed to undergo a cyclic compression without risking the dislodging of the contact unit from the assembly. This contributes to the reduction in cost.

The gold plate layer 8a was formed prior to the coiling process in the embodiment illustrated in FIG. 2, but the coil wire 3a may be subjected to the coiling process without any gold plating process so that only a single gold plate layer (corresponding to the second gold plate layer 8b) is formed over the surface of the assembly.

Figure 7A:
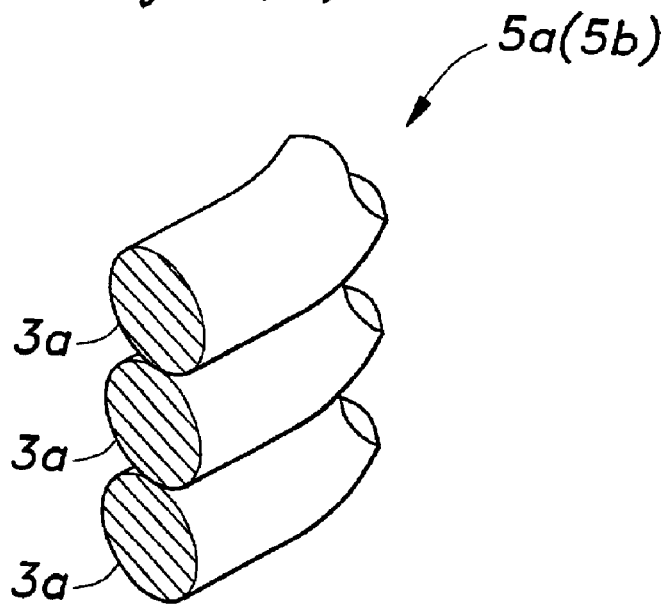
FIG. 7(a) is a fragmentary perspective view of an essential part of a coil wire following a coiling process.
Figure 7B:
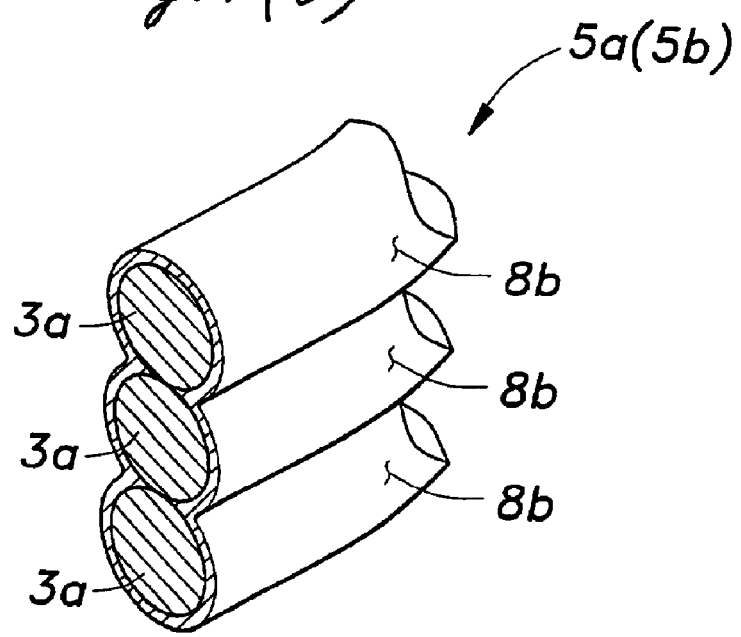
FIG. 7(b) is a similar view following a gold plating process.

For instance, as shown in FIG. 7(a), the coil wire 3a may be subjected to a coiling process so as to form a coil spring portion 4 and electrode pin portions 5a and 5b which consist of closely wound sections as was the case in the previous embodiments. A gold plating process is applied to the assembly in the state illustrated in FIG. 7(a), and a gold plate layer 8b is formed over the entire outer circumferential surface of each closely wound section. In this case also, the plating material is not limited to gold but may consist of Ni or Cu.

In either case, the material for the coil wire 3a may be selected freely without regard to the electric conductivity, and may consist of inexpensive spring material.

What is claimed is:

1. An electroconductive contact unit assembly comprising an electroconductive contact unit in the form of a coil spring for resiliently contacting an object to be contacted, the contact unit being coaxially received in a through hole formed in an insulating support member, characterized by that:

the through hole having a first diameter in an intermediate portion positioned between first and second axial ends and a reduced diameter portion adjacent at least one of the axial ends;

the contact unit in the form of a coil spring comprising a coil spring portion having a coarsely wound portion positioned in the intermediate portion of the through hole and at least one electrode pin portion comprising a closely wound portion at one end of the coil spring portion, the closely wound portion having a tapered or stepped shape so as to be prevented from coming off by the reduced diameter portion;

only the closely wound portion of the contact unit being surface processed so as to include a first layer of electroconductive material that covers an outer surface defined by a plurality of turns of the closely wound portion of the coil spring in a continuous manner.

2. An electroconductive contact unit assembly according to claim 1, wherein the reduced diameter portion comprises a tapered hole section provided at each axial end of the through hole, and the electrode pin portion is formed at each end of the coil spring portion, and is tapered in shape and closely wound so as to be prevented from coming off by the corresponding tapered hole section of the through hole.

3. An electroconductive contact unit assembly according to claim 1, wherein the reduced diameter portion has a smaller inner diameter than an outer diameter of the coil spring portion, and is provided at each axial end of the through hole.

4. An electroconductive contact unit assembly according to claim 1, wherein the coil spring portion is wound at a uniform pitch.

5. An electroconductive contact unit assembly according to claim 4, wherein the electrode pin portions are each closely wound with a pre-stress.

6. An electroconductive contact unit according to claim 4, wherein the surface processing is conducted after the coil spring portion and electrode pin portions are formed out of a wire member.

7. An electroconductive contact unit according to claim 5, wherein the surface processing is conducted after the coil spring portion and electrode pin portions are formed out of a wire member.

8. An electroconductive contact unit according to claim 4, wherein the surface processing is conducted both before and after the coil spring portion and electrode pin portions are formed out of a wire member.

9. An electroconductive contact unit according to claim 5, wherein the surface processing is conducted both before and after the coil spring portion and electrode pin portions are formed out of a wire member.

10. An electroconductive contact unit assembly according to claim 1, wherein the electrode pin portions are each closely wound with a pre-stress.

11. An electroconductive contact unit according to claim 5, wherein the surface processing is conducted after the coil spring portion and electrode pin portions are formed out of a wire member.

12. An electroconductive contact unit according to claim 10, wherein the surface processing is conducted both before and after the coil spring portion and electrode pin portions are formed out of a wire member.

13. An electroconductive contact unit according to claim 1, wherein the surface processing is conducted after the coil spring portion and electrode pin portions are formed out of a wire member.

14. An electroconductive contact unit according to claim 13, wherein the surface processing is conducted after the coil spring portion and electrode pin portions are formed out of a wire member.

15. An electroconductive contact unit according to claim 1, wherein the surface processing is conducted both before and after the coil spring portion and electrode pin portions are formed out of a wire member.

16. An electroconductive contact unit assembly according to claim 1, wherein the layer of electroconductive material comprises a plated layer.

17. An electroconductive contact unit assembly according to claim 1, wherein the electroconductive material comprises a member selected from a group consisting of gold, nickel and copper.

18. An electroconductive contact unit assembly according to claim 1, wherein each turn of a wire member that forms the coil spring includes a second layer of electroconductive material, and further wherein the second layer of electroconductive material is beneath the first layer of electroconductive material.

* * * * *